United States Patent
Barthold

(10) Patent No.: US 9,111,678 B2
(45) Date of Patent: Aug. 18, 2015

(54) PLANAR CORE-TYPE UNIFORM EXTERNAL FIELD EQUALIZER AND FABRICATION

(71) Applicant: Fred O. Barthold, Leucadia, CA (US)

(72) Inventor: Fred O. Barthold, Leucadia, CA (US)

(*) Notice: Subject to any disclaimer, the term of this patent is extended or adjusted under 35 U.S.C. 154(b) by 0 days.

(21) Appl. No.: 14/246,860

(22) Filed: Apr. 7, 2014

(65) Prior Publication Data

US 2014/0300442 A1    Oct. 9, 2014

Related U.S. Application Data

(60) Provisional application No. 61/810,091, filed on Apr. 9, 2013.

(51) Int. Cl.
*H01F 27/36* (2006.01)
*H01F 5/00* (2006.01)
(Continued)

(52) U.S. Cl.
CPC ............ *H01F 27/2804* (2013.01); *H05K 1/165* (2013.01); *H01F 2027/2809* (2013.01); *H01F 2027/2819* (2013.01); *H02M 3/158* (2013.01); *H02M 2003/1557* (2013.01); *H05K 1/0298* (2013.01); *H05K 2201/086* (2013.01); *H05K 2201/09063* (2013.01); *Y10T 29/4902* (2015.01); *Y10T 29/49073* (2015.01)

(58) Field of Classification Search
CPC ... H01F 27/362; H01F 27/36; H01F 27/2804; H01F 19/04; H01F 41/041; H01F 41/04; H01F 41/10; H01F 41/0213; H01F 41/127; H01F 41/0226; H01F 17/013; H01F 17/0006; H01F 17/0033; H01F 27/288; H01F 27/2885; H01F 2027/2809; H01F 2027/2819; Y10T 29/49073; Y10T 29/4902; H02M 2003/1557; H02M 3/158; H05K 1/0298; H05K 1/165; H05K 2201/086; H05K 2201/09063
USPC ...... 336/200, 212, 232, 223, 84 R, 84 C, 182; 29/602.1, 606
See application file for complete search history.

(56) References Cited

U.S. PATENT DOCUMENTS

| 5,719,544 A | 2/1998 | Vinciarelli et al. |
| 6,362,986 B1 | 3/2002 | Schultz et al. |

(Continued)

FOREIGN PATENT DOCUMENTS

WO    2012001398    1/2012

OTHER PUBLICATIONS

E. E. Landsman, "A Unifying Derivation of Switching DC-DC Converter Topologies", PESC '79 Record, San Diego, Calif., Jun. 18-22, 1979, pp. 239-243.

(Continued)

*Primary Examiner* — Mangtin Lian
(74) *Attorney, Agent, or Firm* — Van Pelt, Yi & James LLP

(57) ABSTRACT

A device is disclosed to include: a first set of windings and a second set of windings that are formed in a printed wiring board (PWB) and that are to be magnetically coupled, wherein upon receiving an applied voltage, the first set of windings generates a first uniform external field and induces the second set of windings to generate a second uniform external field; a first conductor formed in the PWB and positioned at a first location that is within the first uniform external field; and a second conductor formed in the PWB and positioned at a second location that is within the second uniform external field; wherein the first conductor and the second conductor are galvanically coupled.

18 Claims, 14 Drawing Sheets

(51) Int. Cl.
    *H01F 27/24*     (2006.01)
    *H01F 41/02*     (2006.01)
    *H01F 7/06*      (2006.01)
    *H01F 27/28*     (2006.01)
    *H05K 1/16*      (2006.01)
    *H02M 3/155*         (2006.01)
    *H02M 3/158*         (2006.01)
    *H05K 1/02*          (2006.01)

(56) References Cited

U.S. PATENT DOCUMENTS

| | | |
|---|---|---|
| 6,429,763 B1 | 8/2002 | Patel et al. |
| 6,653,924 B2 | 11/2003 | Vinciarelli et al. |
| 7,777,458 B2 | 8/2010 | Barthold |
| 7,812,577 B2 | 10/2010 | Barthold |
| 7,889,041 B2 * | 2/2011 | Minteer ................ 336/200 |
| 7,936,244 B2 | 5/2011 | Hansen |
| 8,013,708 B2 | 9/2011 | Tsai |
| 2004/0080978 A1 | 4/2004 | Jitaru |
| 2007/0188284 A1 | 8/2007 | Dobbs |
| 2009/0146066 A1 * | 6/2009 | Renz et al. ........... 250/363.04 |
| 2009/0174375 A1 | 7/2009 | Barthold |
| 2013/0057372 A1 * | 3/2013 | Klein ................... 335/299 |
| 2013/0207767 A1 * | 8/2013 | Worthington ........ 336/84 C |

OTHER PUBLICATIONS

R. Morrison, "Grounding and Shielding Techniques in Instrumentation, 2nd Ed.", John Wiley & Sons, New York, N.Y. 1977, pp. 33-48.

R. D. Middlebrook et al., "Advances in Switched-Mode Power Conversion", vols. I and II, 1983, pp. 205-218.

R. Lee, "Electronic Transformers and Circuits" (second edition), John Wiley & Sons, New York, N.Y., 1961, pp. 102 and 204.

* cited by examiner

US 9,111,678 B2

PLANAR CORE-TYPE UNIFORM EXTERNAL FIELD EQUALIZER AND FABRICATION

CROSS REFERENCE TO OTHER APPLICATIONS

This application claims priority to U.S. Provisional Patent Application No. 61/810,091 entitled PLANAR CORE-TYPE UNIFORM EXTERNAL FIELD EQUALIZER AND A PLANAR CORE FOR MAXIMUM MAGNETIC VOLUME UTILIZATION filed Apr. 9, 2013 which is incorporated herein by reference in its entirety for all purposes.

BACKGROUND OF THE INVENTION

In many circuit designs involving magnetics (e.g., transformers), magnetic flux fields generated external to the coupled magnetic medium (core) are present. Usually undesirable, these external fields are commonly referred to as "leakage," and are sometimes confined or suppressed by shading bands or flux shields so deployed as to induce countervailing effects. However, the gapped magnetic medium generates a second and different form of external field because of the so-called "fringing effect." This type of external field is not ordinarily subjected to suppression but may be redistributed or redirected. Coupled magnetic mediums with separate, shared, and gapped magnetic paths will generally exhibit a "fringing effect" imbalance between the coupled applied/induced magnetic medium paths, with attendant and inimical effects on operating parameters. For example, in a Single Ended Primary Inductance Converter (SEPIC) fed BUCK converter, values for parameters such as $2\phi$ and $L_{SFB}$ (parasitic inductance) are greater when the converter is constructed using magnetics whose fringing effects are not compensated.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A planar uniform external field equalizer and its fabrication is disclosed. As used herein, a planar structure refers to a structure that is formed using one or more printed wiring boards (PWBs) (also referred to as printed circuit boards). A typical PWB includes layers of conductive material separated by layers of insulating material, and connected using vias. In some embodiments, two sets of magnetically coupled windings are formed in a PWB. Upon receiving an applied voltage, the first set of windings generates a first uniform external field and induces the second set of windings to generate a second uniform external field. To equalize the fringing effects in the UEFs, a first conductor is formed in the PWB and positioned at a first location that is within the first uniform external field, and a second conductor is formed in the PWB and positioned at a second location that is within the second uniform external field.

Figure 1:
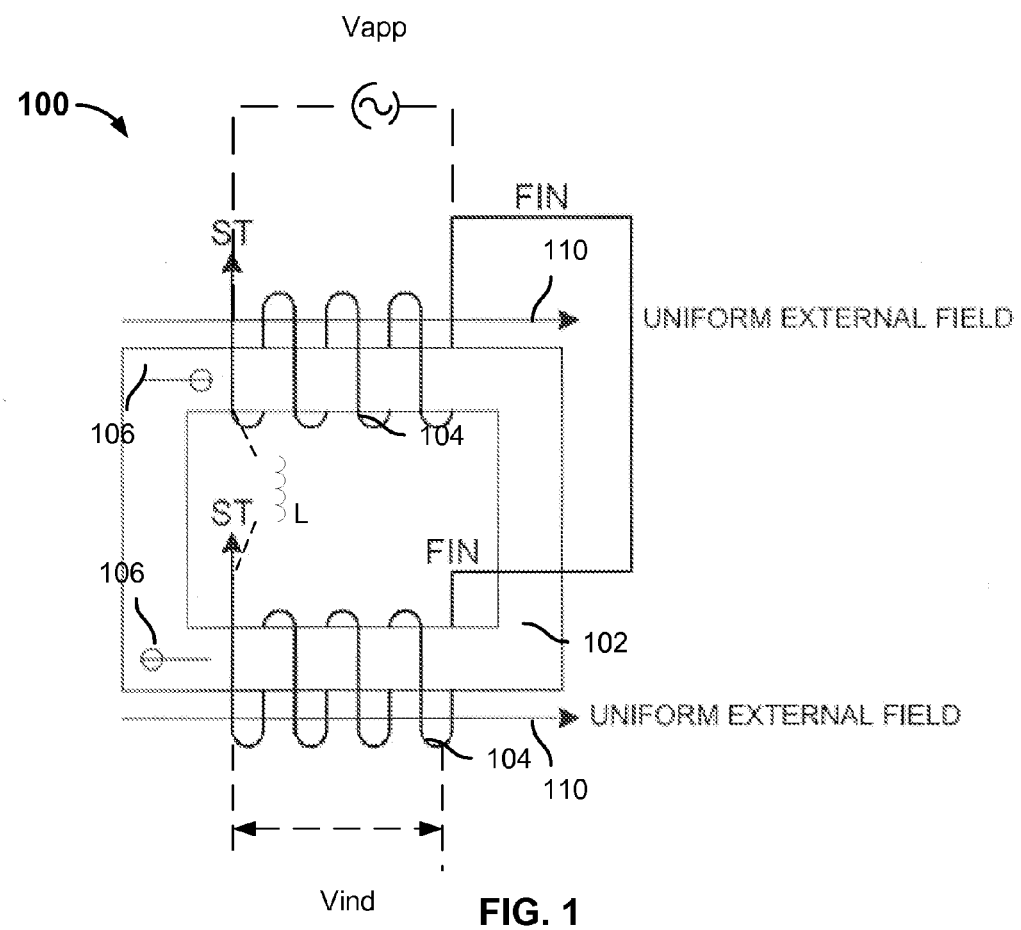
FIG. 1 is a diagram illustrating a typical core-type transformer.

FIG. 1 is a diagram illustrating a typical core-type transformer. Transformer 100 includes electromagnetic core 102 coupled to two sets of windings 104. The windings (also referred to as conductive coils) formed using conductive wires that are magnetically coupled, such that change in current flow through one set of coils induces a voltage across the ends of the other set of coils. When a voltage is applied to the windings, magnetic flux is induced in opposite directions in the two core legs, as illustrated by notations 106. In addition, there is a secondary, uniform external magnetic field that travels in the same direction in both legs and that is external to core 102, illustrated by arrows 110. For purposes of illustration, the arrows are shown to point to one direction; however, the direction of the uniform external magnetic field can change when the applied voltage changes.

The secondary uniform external field (UEF) exists in the regions proximate to the windings and between the windings and the core. While the transformer is in steady state, the induced voltages caused by the uniform external field are identical in the two coils and cancel each other. When the transformer is in dynamic state (such as when a voltage is initially applied to the windings or when the voltage is turned off), however, there can be fringing effects that produces extraneous inductance and parasitic field effects. For example, when an applied voltage $V_{app}$ is applied across the top half of the windings (also referred to as the primary side), an induced voltage $V_{ind}$ appears across the bottom half of the windings (also referred to as the secondary side). The difference between $V_{app}$ and $V_{ind}$ leads to fringing effects; specifically, a parasitic inductance L is introduced (shown in dash). The parasitic inductance leads to losses and should be minimized.

In some embodiments, an external field equalizer is used to alleviate the fringing effects. As discussed in greater detail below, some embodiments of an external field equalizer symmetrically deploy two or more conductors within the two or more uniform external fields of a coupled magnetic medium (such as the magnetic core of a transformer) with a separate, shared, and gapped magnetic path. The conductors are galvanically coupled, forcing the applied/induced UEF's toward equilibrium, thus restoring the conventional "fringing effect" parameters.

Figure 2:
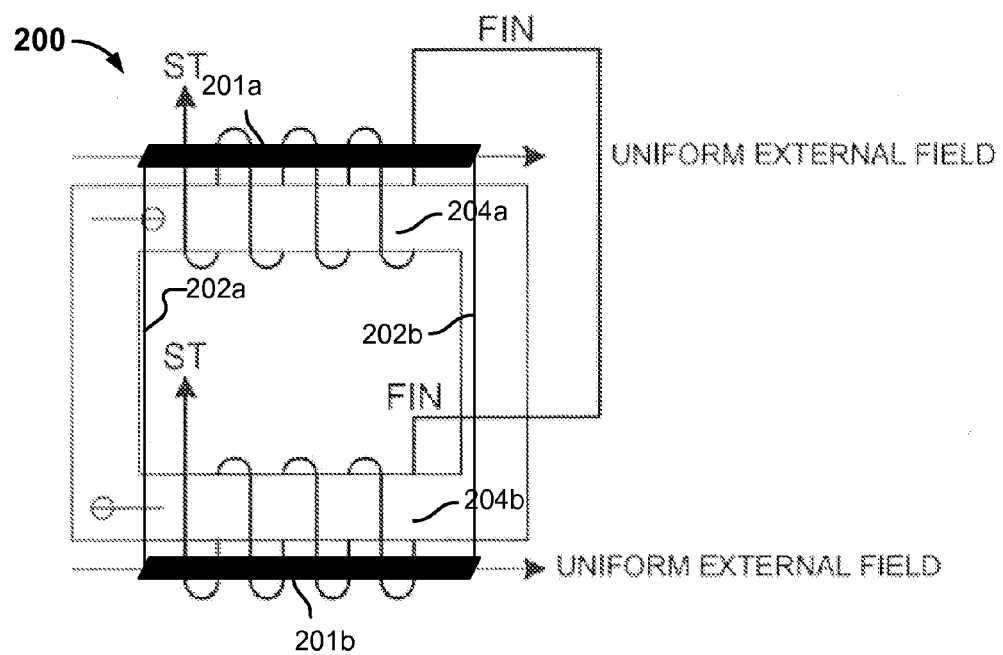
FIG. 2 is a diagram illustrating an embodiment of a transformer circuit with an external field equalizer.

FIG. 2 is a diagram illustrating an embodiment of a transformer circuit with an external field equalizer. In transformer circuit 200, conductors 201a and 201b form the equalizer. Conductors 201a and 201b can be formed as plates, wires, or any appropriate shapes using conductive materials, such as copper, alloys, etc. Conductors 201a and 201b are galvanically coupled. In other words, the conductors are in electrical contact such that a closed current path is formed. In the diagram shown, the ends of the conductive plates are physically connected with other conductors such as wires 202a and 202b to form a closed current path. As shown, the conductors are formed inside the windings in the space between the windings and the core. They can also be placed in other locations (e.g., outside the windings) so long as the conductors are within their respective UEF. Conductor 201a is used to detect the UEF in the top portion of the core and conductor 201b is used to detect the UEF in the bottom portion of the core. Since the applied voltage Vapp is an alternating source, the strength of the UEF changes over time, and a voltage is induced across each conductive plate. Since the plates are galvanically coupled, any difference in voltages across the two plates will lead to a current flow, which in turn induces a field that counters the UEF. The process reaches equilibrium when the UEF and the generated field are balanced and the difference in voltages across the conductors approaches zero.

Figure 3A:
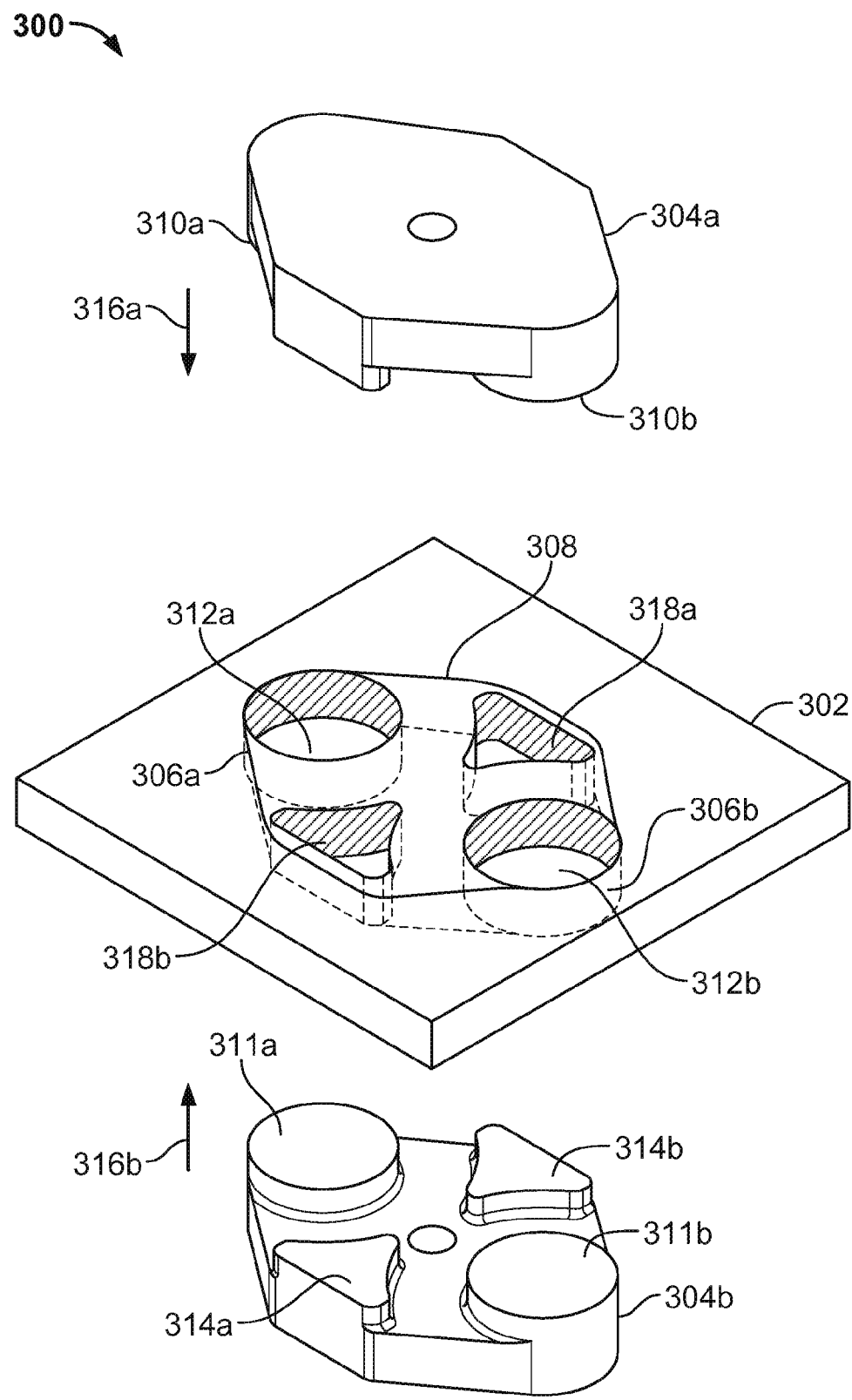
FIG. 3A is an exploded view of an embodiment of a planar core-type transformer with a planar equalizer.

In some embodiments, the equalizer is formed in a planar structure. FIG. 3A is an exploded view of an embodiment of a planar core-type transformer with a planar equalizer. In the example shown, a uniform field equalizer that is built into a planar structure formed in a PWB is used to equalize the fringing effects present in the magnetic core of a transformer.

In this example, transformer 300 includes a planar structure 302 that is formed in a PWB, and a set of magnetic core halves 304a and 304b constructed using ferrite, silicon steel, or other appropriate magnetic material. Planar structure 302 includes a number of openings configured to receive two magnetic core halves 304a and 304b. Built into the PWB are a number of conductive layers (e.g., layers of copper, silver, etc.) separated by layers of insulating material (e.g., layers of plastic, polymer, etc.). In this example, at least a portion of the conductive layers of the PWB forms the two sets of windings of the transformer in regions surrounding circular openings 312a and 312b. The windings (not shown) are embedded in the PWB. Details of the windings are discussed below.

A set of conductive plates 306a and 306b are formed to be in proximity to the windings and are substantially vertical with respect to the top or bottom surfaces of the PWB. Conductive plates 306a and 306b implement conductors 201a and 201b of FIG. 2. The conductive plates are substantially symmetrical. Specifically, the dimensions and placements of the conductive plates are substantially symmetrical in that the conductive plates have approximately the same length and width, and their relative distance and location to their respective set of windings are approximately the same, subject to any variations that may occur during the fabrication process. In this example, conductive plates 306a and 306b are formed as copper layers installed on a portion of the vertical surface of the corresponding circular openings 312a and 312b, respectively. Plates 306a and 306b can be laminated, electroplated, or formed using any other appropriate techniques.

As will be described in greater detail below, the PWB is formed to include multiple conductive layers. On an outermost conductive layer (the top conductive layer) of the PWB, a conductive trace 308 is formed (e.g., printed, electroplated, etc.) to connect the ends of the conductive plates. A similar conductive trace (not shown) is formed on the other outermost conductive layer (the bottom conductive layer) of the PWB. The conductive traces correspond to conductors 202a and 202b of FIG. 2 and connect plates 306a and 306b galvanically.

As shown, the magnetic core halves are identical structures. In a transformer assembly, the magnetic core halves are positioned to face each other. 304a shows one side of the structure, which is flat. 306b shows the other side of the structure, which has circular protrusions 311a and 311b, and non-circular protrusions 314a and 314b. The transformer is assembled by placing the protrusions of magnetic core halves within the corresponding openings on the planar structure 302 and bringing the magnetic core halves together in the directions shown by arrows 316a and 316b, such that the surfaces of circular protrusions 310a and 311a are in contact, and the surfaces of circular protrusions 310b and 311b are in contact. Together, the pillar formed by joining protrusions 310a and 311a corresponds to leg 204a of FIG. 2, and the pillar formed by protrusions 310b and 311b corresponds to leg 204b of FIG. 2. When voltage is applied to the transformer (e.g., by connecting a voltage source to connection points that are in contact with a set of coils), the conductive plates function as an equalizer for the transformer. Other magnetic core structures can be used, such as a three-legged planar core structure.

In this example, protrusions 311a and 311b are taller than protrusions 314a and 314b. The height difference between protrusion 311a (or 311b) and 314a (or 314b) is one half of the total gap distance of the transformer (represented as lg/2). In other embodiments employing other core geometry, the gap distance is determined based on the specific geometry of the core according to known computation techniques.

Figure 3B:
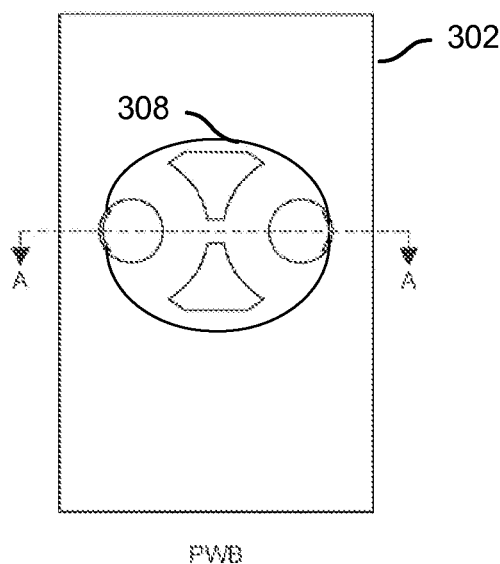
FIG. 3B is a top view of the PWB as shown in FIG. 3A.

FIG. 3B is a top view of the PWB as shown in FIG. 3A. The openings and conductive trace 308 are shown.

Figure 3C:
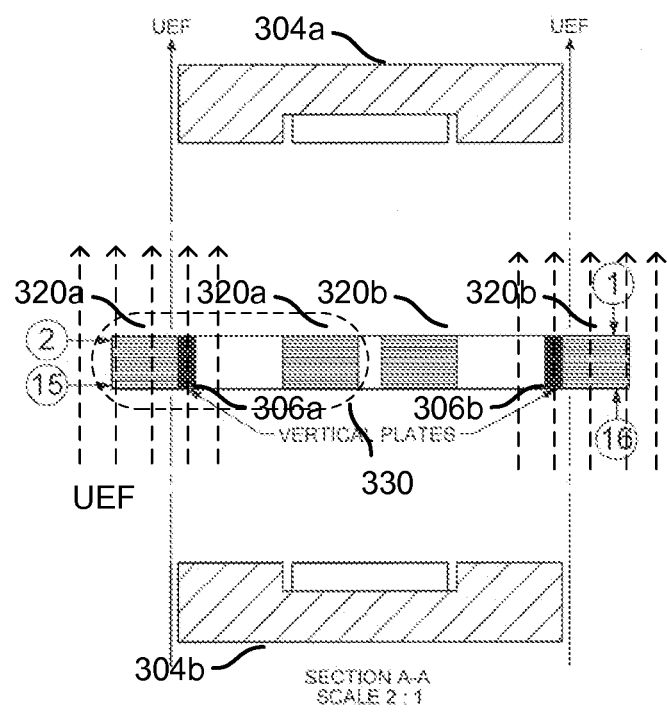
FIG. 3C is a cross sectional view of an example of an embodiment of a planar transformer comprising a uniform field equalizer.

FIG. 3C is a cross sectional view of an example of an embodiment of a planar transformer comprising a uniform field equalizer. In this example, a cross section along the line AA illustrated in FIG. 3B and perpendicular to the top and bottom surfaces of the PWB is shown. As shown, the PWB used to construct the transformer and its equalizer has 16 conductive layers comprising conductive material such as copper. The conductive layers are separated by insulating layers comprising non-conductive material such as plastic or polymer. The PWB has a thickness of approximately 155 milliinches. Different number of layers and different PWB thickness may be employed in other embodiments. The uniform field equalizer includes the vertical plates and conductive traces connecting the plates. The middle conductive layers (e.g., any of the layers 2-15) form the windings, which are connected using buried vias using known techniques. Different number of turns may be formed in the primary windings and the secondary windings by connecting different number of layers. Cross sections of conductive layers 320a-320b and vertical plates 306a-306b are shown. Magnetic core halves 304a and 304b are also illustrated.

Figure 3D:
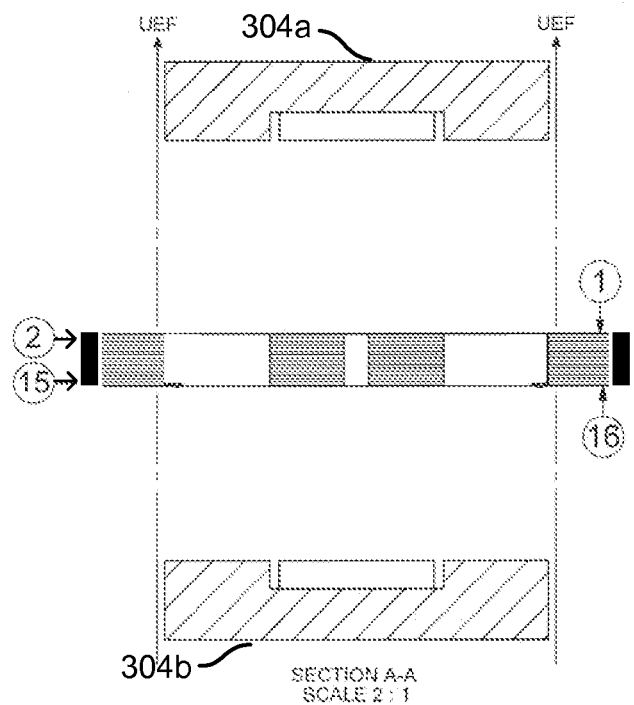
FIG. 3D is a cross sectional view of another example of an embodiment of a planar transformer comprising a uniform field equalizer.

The UEF field lines are shown in the figure. To ensure that the plates detect the UEF in approximately the same way, the plates are positioned in such a way that their relative positions with respect to their respective windings are approximately the same; in other words, the plates are approximately at the same distance, angle, and orientation relative to their respective sets of windings. In FIG. 3C, the plates are positioned between the windings and the core. In FIG. 3D, the plates are positioned outside the windings. Various placement schemes for the plates can be used in different embodiments, so long as the plates are sufficiently close in proximity to the windings for the plates to be within the UEF. Preferably, the plates are positioned such that the distance between a plate and its closest set of windings is no more than the thickness of a coil (in other words, the thickness of the conductive layer) to ensure that the conductive plate is within the respective UEF when the UEF is present.

Figure 3E:
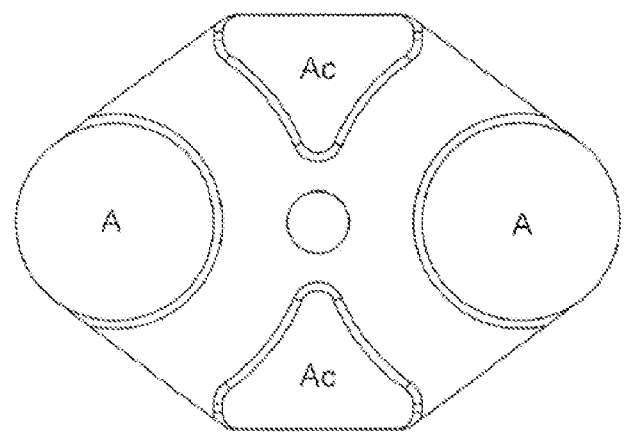
FIG. 3E is a top view of an embodiment of a core half structure such as 304a or 304b of FIG. 3A.
Figure 3F:
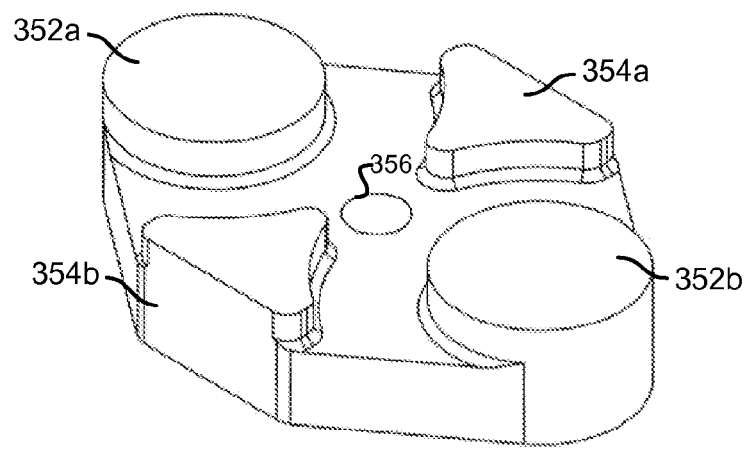
FIG. 3F is a three dimensional view of an embodiment of a core half structure such as 304a or 304b of FIG. 3A.
Figure 3G:
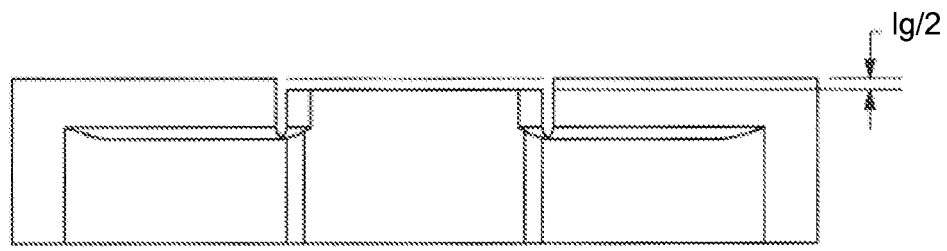
FIG. 3G is a side view of an embodiment of a core half structure such as 304a or 304b.

FIG. 3E is a top view of an embodiment of a core half structure such as 304a or 304b of FIG. 3A. FIG. 3F is a three dimensional view of an embodiment of a core half structure such as 304a or 304b of FIG. 3A. In some embodiments, the core half structure is constructed using ferrite material. Protrusions 352a and 352b are taller than protrusions 354a and 354b. The core half structure optionally includes a center hole 356 to provide physical symmetry to the magnetic flux paths. The placement and size of such a center hole depend on implementation and are known to those skilled in the art. The structure may be formed by machining, casting, molding (including injection molding), or using any other appropriate techniques. FIG. 3G is a side view of an embodiment of a core half structure such as 304a or 304b. The height difference of protrusion 354a (or 354b) and protrusion 352a (or 352b) is shown as lg, which is also referred to as the gap of the transformer.

Figure 3H:
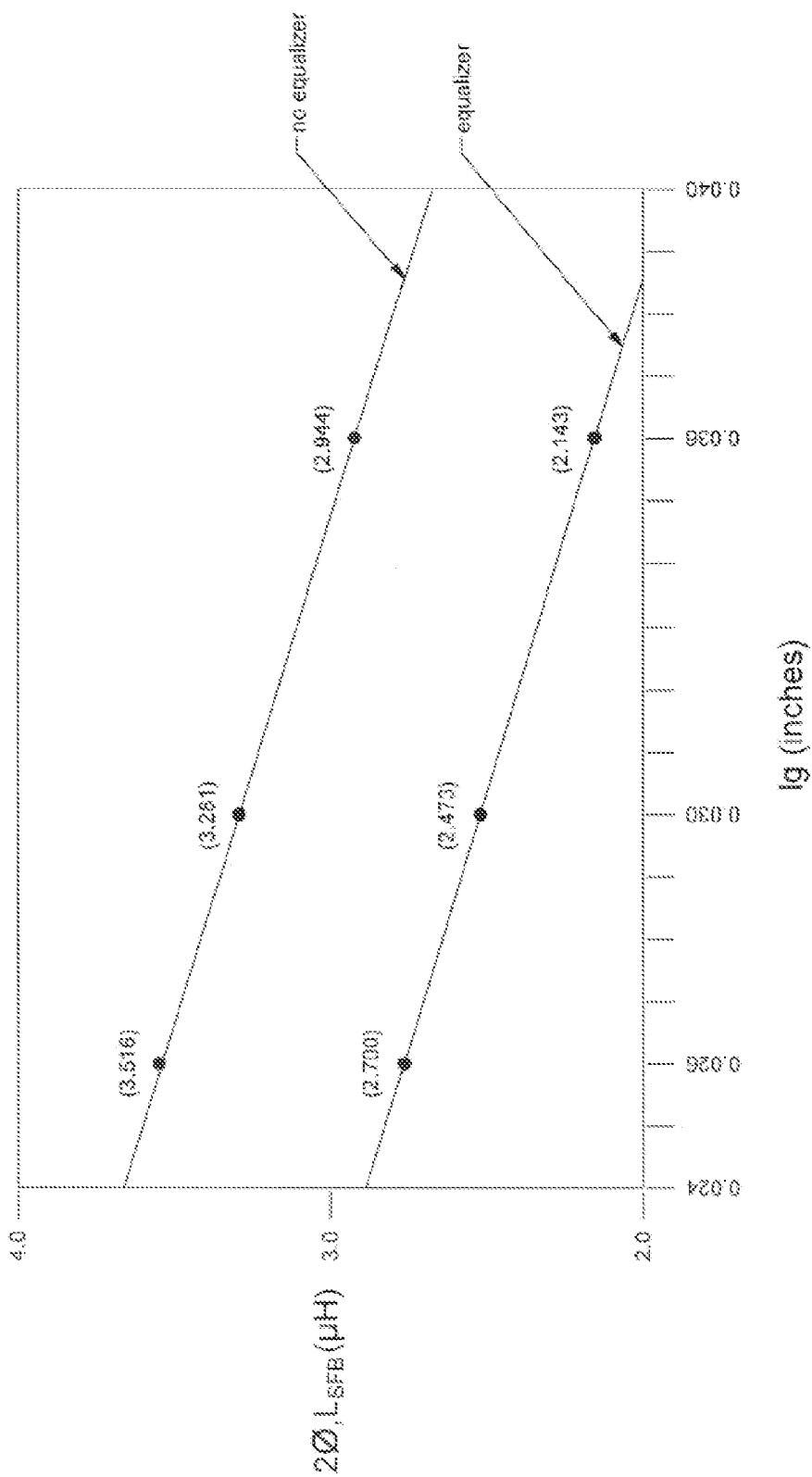
FIG. 3H is a graph illustrating embodiments of uniform field equalizer functions.

FIG. 3H is a graph illustrating embodiments of uniform field equalizer functions. The functions characterize the inductor core. As shown, the values of (2φ, $L_{SFB}$) are greater for an inductor core without an equalizer because the parasitic inductance is greater when the equalizer is not present. A designer with a particular inductance (2φ, $L_{SFB}$) in mind can select an appropriate lg shielded by the equalizer.

Figure 4:
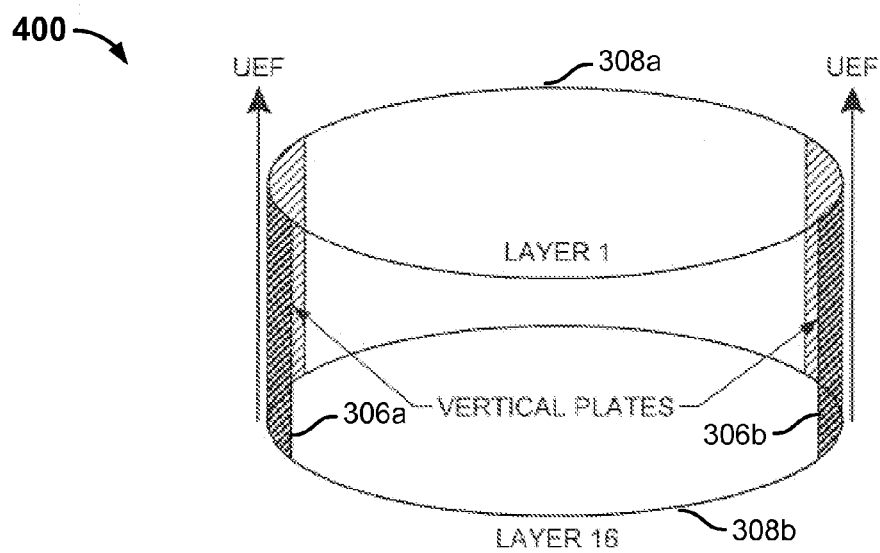
FIG. 4 is a structural diagram illustrating an embodiment of a uniform field equalizer.

FIG. 4 is a structural diagram illustrating an embodiment of a uniform field equalizer. The structure of equalizer 400 can be incorporated in 300 of FIG. 3A. Conductive plates 306a and 306b, and conductive traces 308a and 308b connecting the plates are shown. In this example, the PWB includes 16 conductive layers, and the vertical plates are galvanically coupled via conductive traces 308a and 308b in outermost conductive layers (layer 1 and layer 16). Although the length of the plate is maximized when layers 1 and 16 are used, conductive traces can be formed in other layers to connect the plates.

Figure 5:
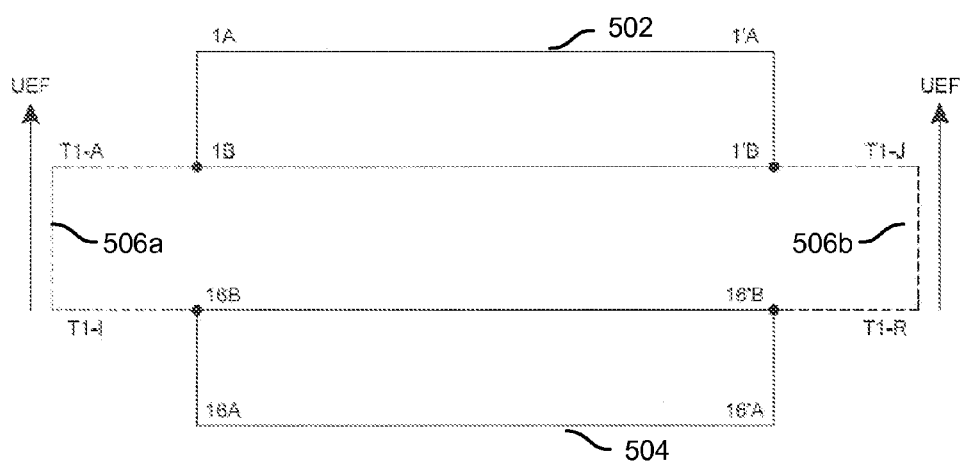
FIG. 5 is a schematic view illustrating an embodiment of a uniform field equalizer.

FIG. 5 is a schematic view illustrating an embodiment of a uniform field equalizer. As shown, the outermost conductive layers 502 and 504, and vertical plates 506a and 506b are galvanically coupled. When there is imbalance in the uniform external fields, current flows through the galvanic connection to balance the fields.

Figure 6:
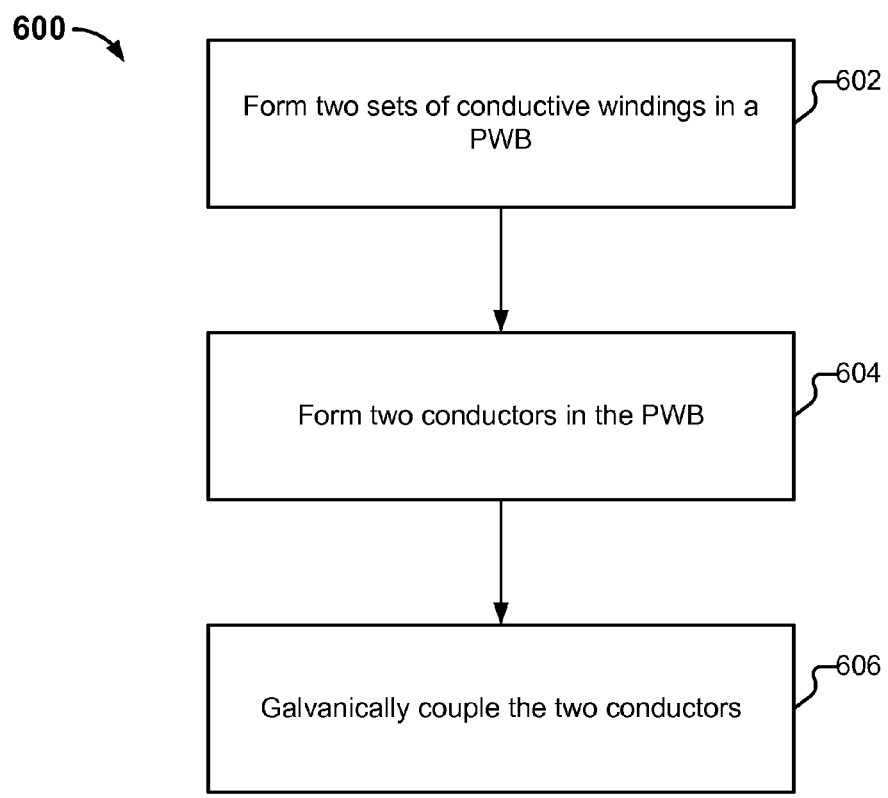
FIG. 6 is a flowchart illustrating an embodiment of a process of constructing a planar structure comprising an equalizer.

FIG. 6 is a flowchart illustrating an embodiment of a process of constructing a planar structure comprising an equalizer. Process 600 can be used to construct a planar structure such as 302 of FIG. 3A.

At 602, two sets of windings are formed in a PWB.

In some embodiments, the PWB is formed by: forming on multiple individual layers of insulating material a single set of winding turns, forming vias on the insulating material, and combining the layers. In some embodiments, two winding turns having the desired winding diameter and spacing are etched on a single layer of conductive material overlaying a layer of insulating material. In some embodiments, the conductive material is printed or otherwise deposited on a single layer of insulating material to form the winding turn patterns with desired diameter and spacing. The diameter and spacing of the winding patterns depend on the application and may vary in different embodiments. Vertical openings are formed by drilling or otherwise puncturing the board. The openings are filled with conductive material to form vias.

The printing/etching process is repeated on multiple single layer boards to obtain the desired number of layers (e.g., 14 individual layers to produce a winding with 14 turns for the 16-layer PWB example discussed above). The individual layers are combined (e.g., laminated) to form the planar structure in which the winding patterns of the individual layers are connected by the vias to form two sets of windings. Fewer layers may be used if fewer turns are desired. The formation of the sets of windings is illustrated in FIGS. 7 and 8.

Figure 7:
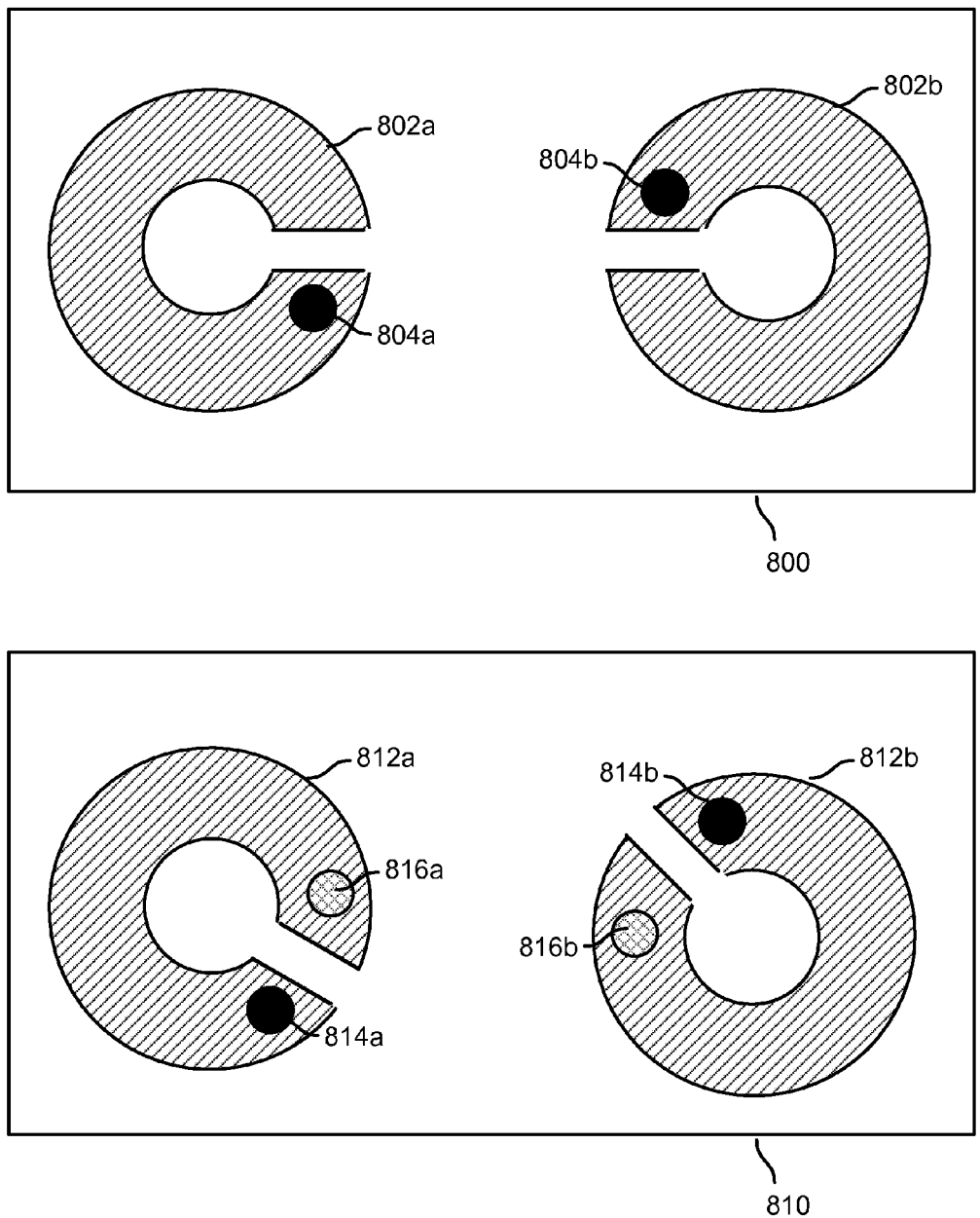
FIG. 7 is an example top view of the patterns formed on individual layers.

FIG. 7 is an example top view of the patterns formed on individual layers. Two layers 800 and 810 are shown. On insulating layer 800, a layer of conductive material forms winding turns 802a and 802b. Vias are formed at 804a and 804b. On a separate insulating layer 810, a layer of conductive material forms winding turns 812a and 812b. Vias are formed at 814a and 814b. When the layers are combined, vias 804a and 804b connect the patterns formed on insulating layer 800 with the patterns formed on insulating layer 810 at locations 816a and 816b, respectively. Similarly, vias 814a and 814b connect the patterns formed on insulating layer 810 with the patterns formed on a subsequent insulating layer (not shown). A cross sectional portion of a coil is illustrated in FIG. 8.

Figure 8:
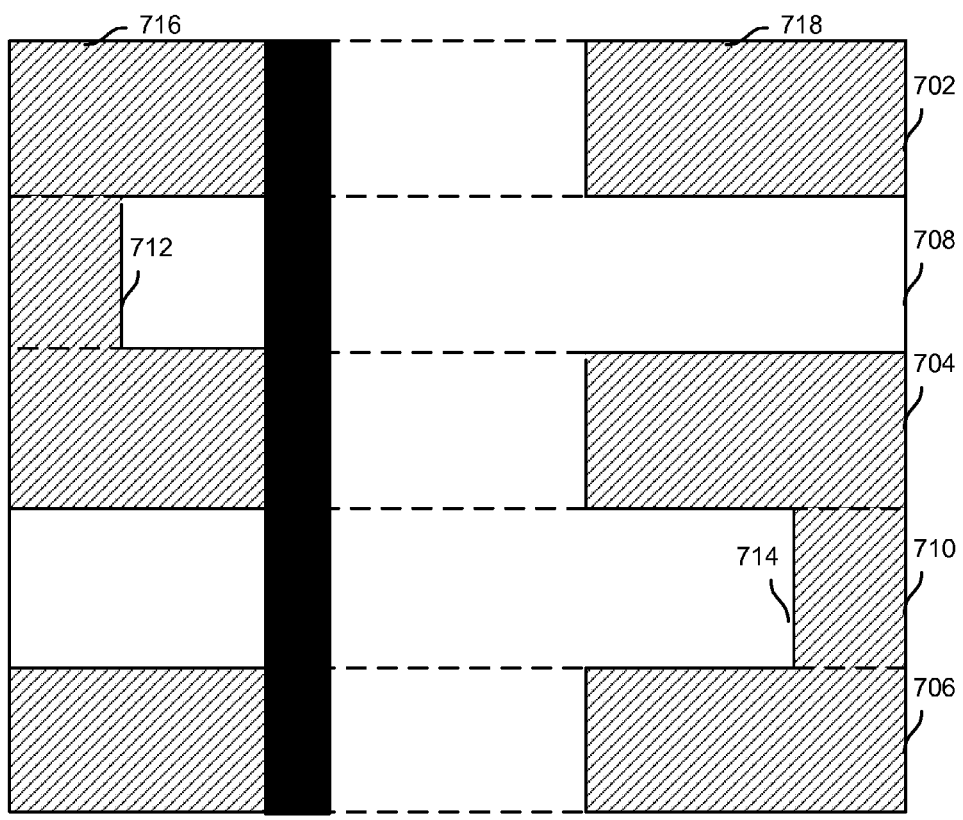
FIG. 8 is a diagram illustrating an enlarged cross sectional view that corresponds to region 330 shown in FIG. 3C.

FIG. 8 is a diagram illustrating an enlarged cross sectional view that corresponds to region 330 shown in FIG. 3C. Only three conductive layers 702, 704, and 706 are shown for purposes of illustration, although additional layers are used in the circuit. Within the same layer, conductive portions such as 716 and 718 are electrically connected. The conductive layers are separated by insulating layers 708 and 710. To connect two adjacent conductive layers, vias such as 712 and 714 are formed by drilling openings in the insulating layers and filling the openings with conductive material (e.g., copper or other metal). In various embodiments, the size and locations of the vias may differ.

Returning to FIG. 6, at 604, two conductors (e.g., 306a and 306b of FIG. 3A) are formed in the multi-layer PWB that includes the windings. As described above, the first conductor is formed in the PWB and positioned at a first location that is within the first UEF, and a second conductor is formed in the PWB and positioned at a second location that is within the second UEF, when such UEFs are present as a result of an applied voltage to a set of the windings. In some embodiments, to form the conductors, openings are formed in proximity to the windings. For example, openings such as 312*a* and 312*b* of FIG. 3A are formed in the composite PWB within the windings to receive the magnetic core, and the conductors are formed (e.g., laminated or otherwise affixed) at their respective locations on the surface of the openings. In embodiments such as shown in FIG. 3D, additional openings may be needed to accommodate the inductors. As discussed above, the locations of the conductors are chosen to ensure that the uniform external fields are detected and equalized.

Returning to FIG. 6, at 606, the first conductor and the second conductor are galvanically coupled. In some embodiments, to galvanically couple the first conductor and the second conductor, conductive traces are formed on the outermost layers of the PWB.

The steps in process 600 may be performed in different order. For example, 606 does not necessarily need to occur after 602 or 604. Additional processing may be carried out as needed. For example, other openings such as 318*a* and 318*b* of FIG. 3A may be formed. Other circuit components may be formed depending on the requirements of the application.

Figure 9A:
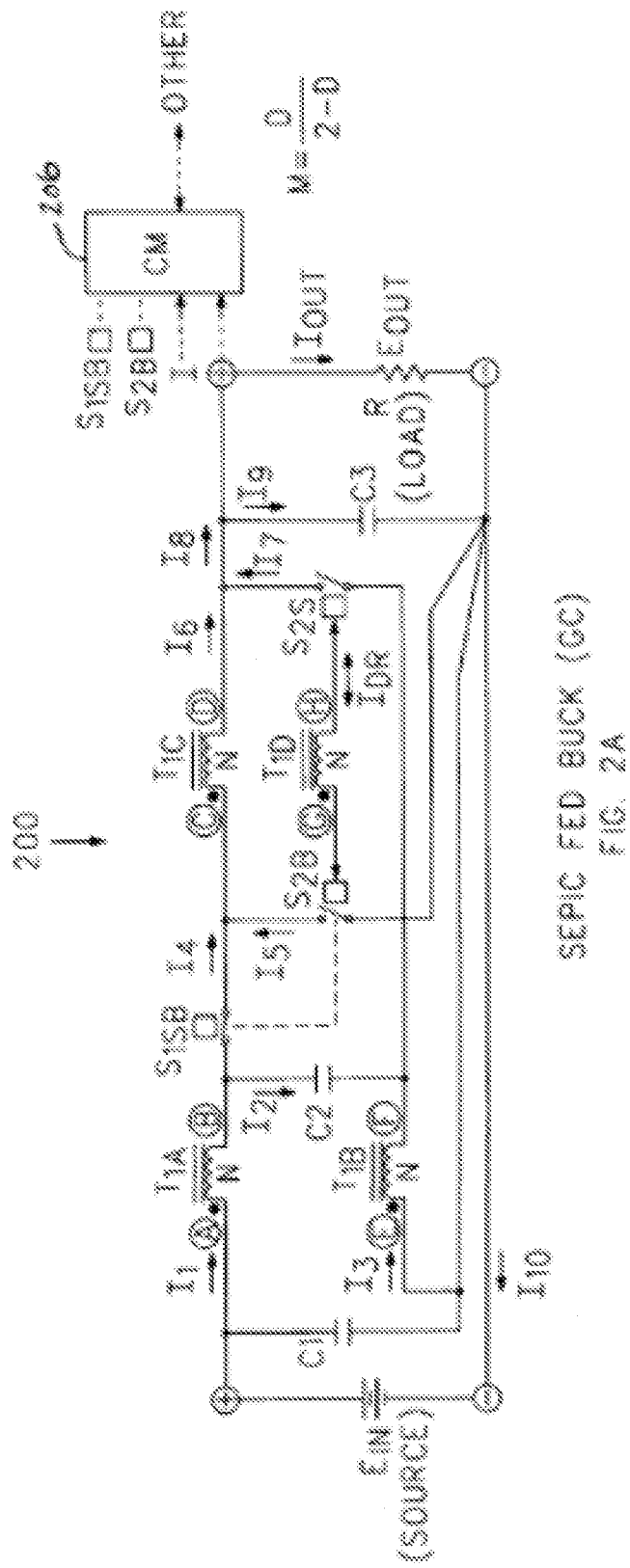
FIGS. 9A-9B are embodiments of SEPIC-FED BUCK converters.
Figure 9B:
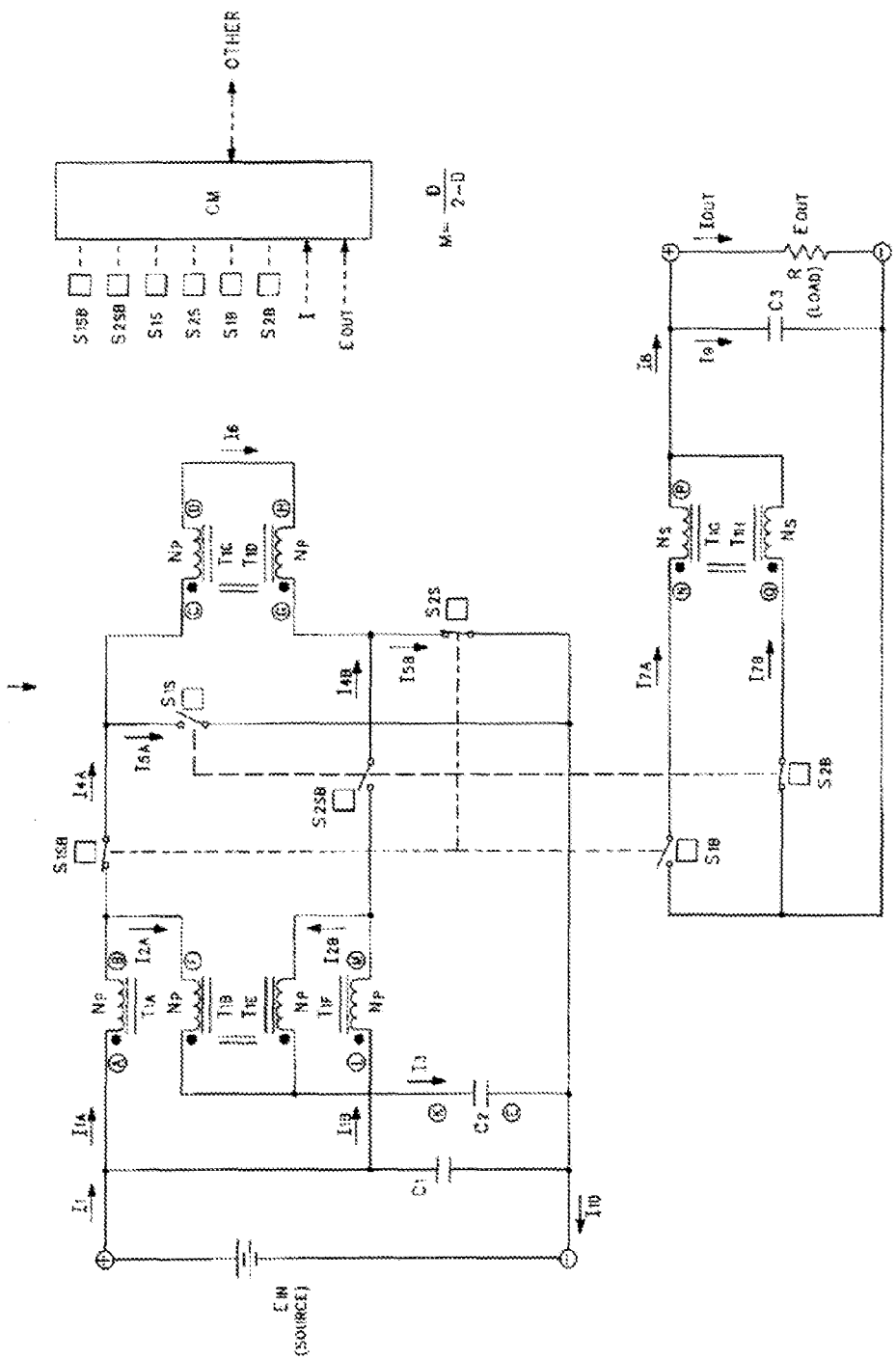

The equalized transformer may be used in a variety of applications such as switched converters. For example, FIGS. 9A-9B are embodiments of SEPIC-FED BUCK converters. The transformers in these SEPIC-FED BUCK converters can be implemented using the transformers with UEF equalizers described above. Additional details of SEPIC-FED BUCK converters are described in U.S. Pat. No. 7,812,577 entitled SEPIC FED BUCK CONVERTER, which is incorporated by reference in its entirety for all purposes.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device comprising:
    a first set of windings and a second set of windings that are formed in a printed wiring board (PWB) and that are to be magnetically coupled, wherein upon receiving an applied voltage, the first set of windings generates a first uniform external field and induces the second set of windings to generate a second uniform external field;
    a first conductor formed in the PWB and positioned at a first location that is within the first uniform external field; and
    a second conductor formed in the PWB and positioned at a second location that is within the second uniform external field; wherein:
    the first conductor and the second conductor are galvanically coupled;
    the first conductor is a first conductive plate that is substantially vertical with respect to a top surface of the PWB; and
    the second conductor is a second conductive plate that is substantially vertical with respect to the top surface of the PWB.

2. The device of claim 1, wherein the first conductor and the second conductor are substantially symmetrical.

3. The device of claim 1, wherein the first location is outside the first set of windings and the second location is outside the second set of windings.

4. The device of claim 1, wherein the first location is inside the first set of windings and the second location is inside the second set of windings.

5. The device of claim 1, further comprising a third conductor galvanically coupling a first end of the first conductor and a first end of the second conductor, and a fourth conductor galvanically coupling a second end of the first conductor and a second end of the second conductor.

6. The device of claim 5, wherein the PWB includes a plurality of conductive layers, and the third conductor and the fourth conductor are conductive traces on two outermost layers among the plurality of conductive layers.

7. The device of claim 1, further comprising a magnetic core that is placed within the first set of windings and the second set of windings.

8. The device of claim 7, wherein the magnetic core comprises a plurality of separate portions.

9. The device of claim 1, wherein the device is included in a SEPIC-FED BUCK converter.

10. A method of fabricating a device, comprising:
    forming a first set of windings and a second set of windings in a printed wiring board (PWB), wherein the first set of windings and the second set of windings are to be magnetically coupled, and upon receiving an applied voltage, the first set of windings generates a first uniform external field and induces the second set of windings to generate a second uniform external field;
    forming a first conductor in the PWB and positioned at a first location that is within the first uniform external field, the first conductor being formed as a first conductive plate that is substantially vertical with respect to a top surface of the PWB;
    forming a second conductor in the PWB and positioned at a second location that is within the second uniform external field, the second conductor being formed as a second conductive plate that is substantially vertical with respect to the top surface of the PWB; and
    galvanically coupling the first conductor and the second conductor.

11. The method of claim 10, wherein forming the first conductor and the second conductor includes:
    forming a first opening in proximity of the first set of windings and a second opening in proximity of the second set of windings; and
    forming the first conductor on a surface of the first opening and forming the second conductor on a surface of the second opening.

12. The method of claim 10, wherein the first conductor and the second conductor are formed to be substantially symmetrical.

13. The method of claim 10, wherein the first location is outside the first set of windings and the second location is outside the second set of windings.

14. The method of claim 10, wherein the first location is inside the first set of windings and the second location is inside the second set of windings.

15. The method of claim 10, wherein galvanically coupling the first conductor and the second conductor includes forming a third conductor to galvanically couple a first end of the first conductor and a first end of the second conductor, and forming a fourth conductor to galvanically couple a second end of the first conductor and a second end of the second conductor.

16. The method of claim 15, wherein the PWB includes a plurality of conductive layers, and the third conductor and the fourth conductor are conductive traces on two outermost layers among the plurality of conductive layers.

17. The method of claim 10, further comprising forming a magnetic core and placing the magnetic core within the first set of windings and the second set of windings.

18. The method of claim 17, wherein forming the magnetic core includes forming a plurality of separate portions.

\* \* \* \* \*